United States Patent
Flory et al.

(10) Patent No.: US 6,845,115 B2
(45) Date of Patent: Jan. 18, 2005

(54) COUPLED RESONANT CAVITY SURFACE-EMITTING LASER

(75) Inventors: Curt A. Flory, Los Altos, CA (US); William R. Trutna, Jr., Atherton, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/313,393

(22) Filed: Dec. 5, 2002

(65) Prior Publication Data

US 2004/0109485 A1 Jun. 10, 2004

(51) Int. Cl.⁷ .................................................. H01S 5/00
(52) U.S. Cl. ........................................ 372/43; 372/75
(58) Field of Search .................. 372/50, 47, 20, 372/22, 43, 107, 75, 29.023, 92–109, 46, 45, 102, 48, 49

(56) References Cited

U.S. PATENT DOCUMENTS

| | | | | |
|---|---|---|---|---|
| 5,247,536 A | * | 9/1993 | Kinoshita | 372/96 |
| 5,329,542 A | * | 7/1994 | Westbrook | 372/96 |
| 5,389,797 A | * | 2/1995 | Bryan et al. | 257/21 |
| 5,625,636 A | * | 4/1997 | Bryan et al. | 372/50 |
| 5,682,401 A | * | 10/1997 | Joannopoulos et al. | 372/96 |
| 5,712,865 A | * | 1/1998 | Chow et al. | 372/96 |
| 5,719,891 A | * | 2/1998 | Jewell | 372/45 |
| 5,724,374 A | * | 3/1998 | Jewell | 372/45 |
| 5,897,329 A | * | 4/1999 | Jewell | 438/38 |
| 5,977,612 A | * | 11/1999 | Bour et al. | 257/618 |
| 6,002,705 A | * | 12/1999 | Thornton | 372/96 |
| 6,014,395 A | * | 1/2000 | Jewell | 372/45 |
| 6,144,682 A | * | 11/2000 | Sun | 372/45 |
| 6,181,721 B1 | * | 1/2001 | Geels et al. | 372/45 |
| 6,185,241 B1 | * | 2/2001 | Sun | 372/96 |
| 6,259,121 B1 | * | 7/2001 | Lemoff et al. | 257/88 |
| 6,266,357 B1 | * | 7/2001 | Feld et al. | 372/46 |
| 6,269,109 B1 | * | 7/2001 | Jewell | 372/43 |
| 6,337,871 B1 | * | 1/2002 | Choa | 372/45 |
| 6,396,865 B1 | * | 5/2002 | Mawst et al. | 372/96 |
| 6,459,713 B2 | * | 10/2002 | Jewell | 372/46 |

* cited by examiner

*Primary Examiner*—Minsun Oh Harvey
*Assistant Examiner*—Tuan N. Nguyen
(74) *Attorney, Agent, or Firm*—Ian Hardcastle

(57) ABSTRACT

The CRCSEL comprises a single-mode optical gain structure and an optically-resonant cavity. The single-mode optical gain structure is structured to generate excitation light having a wavelength and a direction. The optically-resonant cavity is optically coupled to the single-mode optical gain structure and is structured to emit an output light beam in a direction substantially orthogonal to the excitation light. The change in light direction provided by the optically-resonant cavity enables the output light beam to emit from a surface while allowing the excitation light to be generated in a large, high-gain single-mode optical gain structure.

22 Claims, 7 Drawing Sheets

COUPLED RESONANT CAVITY SURFACE-EMITTING LASER

BACKGROUND OF THE INVENTION

Semiconductor lasers are key components for use in fiber-optic communications and products such as CD players, CD ROM players and DVD players. Two different semiconductor laser structures are typically available for use in these applications: edge-emitting lasers and vertical-cavity surface-emitting lasers (VCSELs). The edge-emitting laser is the more established of the two semiconductor laser structures. Details of edge-emitting lasers and VCSELs are known in the art. However, to help an understanding of the invention, edge-emitting lasers and VCSELs are briefly described next.

An edge-emitting laser can be fabricated on a single-crystal substrate of semiconductor material such as InP or GaAs. Layers of various semiconductor materials are epitaxially grown on the substrate to form a layer structure that includes a p-i-n double heterostructure. The p-i-n double heterostructure has two principal functions. First, the p-i-n double heterostructure acts as part of an optical waveguide that extends in the plane of the layers constituting the double heterostructure. Second, an active region located in the intrinsic (i) layer of the p-i-n double heterostructure generates light in response to a forward electrical bias applied across the p-i-n double heterostructure. The light is generated by the recombination of holes and electrons injected into the active layer by the forward bias. The active layer typically includes one or more quantum wells.

Subsequent processing adds lateral waveguiding, current-confining structures and electrodes respectively directly or indirectly contacting the p-type and n-type layers of the p-i-n double heterostructure. Fabrication of the individual edge-emitting lasers is completed by cleaving the layer structure into individual die. The cleaving forms facets on the ends of each of the die. The facets are reflective and, together with the waveguide, form an optical cavity. The facets reflect a substantial fraction of the light generated in the active region back into the optical cavity. When optical gain provided by the active layer in the optical cavity exceeds the optical losses in the optical cavity, the semiconductor laser emits coherent light from the facets on the ends of the die. The light is emitted in a direction parallel to the major surface of the die.

VCSELs also include an active layer that generates light, but use a different structure to reflect the light back into the optical cavity. A VCSEL includes an optical cavity composed of an active region sandwiched between two distributed Bragg reflectors (DBRs). The DBRs and the active region are stacked on the substrate. The active region includes a p-i-n double heterostructure. Each of the DBRs is composed of multiple pairs of thin layers of materials having different refractive indices. The DBRs are highly reflective in a narrow wavelength band defined by the refractive indices and thicknesses of the layers. The materials of the DBRs are typically semiconductors or dielectrics. Current injected through a current-confining structure into a narrow region of the active region generates light. The light is emitted through one of the DBRs in a direction normal to the major surface of the substrate. For single transverse-mode VCSELs, the mode diameter is only a few microns and the divergence of the beam is relatively small.

Edge-emitting lasers and VCSELs each have their own advantages and disadvantages. Edge-emitting lasers have a much higher single-pass optical gain as a result of their longer optical cavity. This makes it possible for edge-emitting lasers to be fabricated from a wider range of materials and to generate light over a wider range of wavelengths. Edge-emitting lasers also generally have a better high-temperature behavior. Further, edge-emitting lasers have a much higher single-mode power capability stemming from the larger volume of the optical cavity.

VCSELs have the advantage that they can be tested in wafer form since they do not have to be cleaved to make a laser. VCSELs are typically smaller than edge-emitting lasers. Consequently, they typically require a lower drive current to generate a moderate level of optical power, e.g., 1 milliwatt. This makes VCSELs less expensive to use, since high-current laser drivers are expensive and have high power consumption when operated at high modulation rate. Moreover, the smaller size of VCSELs means that more VCSELs can be made on each wafer and, hence, a lower cost per VCSEL. VCSELs have an optical mode size larger than that of edge-emitting lasers and the optical mode is a better match to single-mode fiber. This makes it easier and cheaper to couple light from the VCSEL to the fiber.

Thus, VCSELs have many advantages, but edge-emitting lasers remain a better solution for higher power applications. What is needed, therefore, is a surface-emitting laser with better high-power characteristics than conventional VCSELs.

SUMMARY OF THE INVENTION

The invention provides a surface-emitting laser that comprises a single-mode optical gain structure and an optically-resonant cavity. The single-mode optical gain structure is structured to generate excitation light having a wavelength and a direction. The optically-resonant cavity is optically coupled to the single-mode optical gain structure and is structured to emit an output light beam in a direction substantially orthogonal to the excitation light.

The invention also provides a method for generating coherent light. In the method, a layer structure that includes an optically-resonant cavity is provided. Excitation light having a single optical mode is generated in a direction parallel to a major surface of the layer structure. Part of the excitation light is received in the optically-resonant cavity, the received excitation light is preferentially emitted from the optically-resonant cavity in a direction orthogonal to the major surface.

The change in light direction provided by the optically-resonant cavity enables the output light beam to emit from a surface while allowing the excitation light to be generated in a large, high-gain single-mode optical gain structure.

BRIEF DESCRIPTION OF THE DRAWINGS

The invention can be better understood with reference to the following drawings. The components in the drawings are not necessarily drawn to scale. Instead, emphasis is placed on clearly illustrating the invention. Like reference numerals designate corresponding parts throughout the several views.

DETAILED DESCRIPTION OF THE INVENTION

Figure 1A:
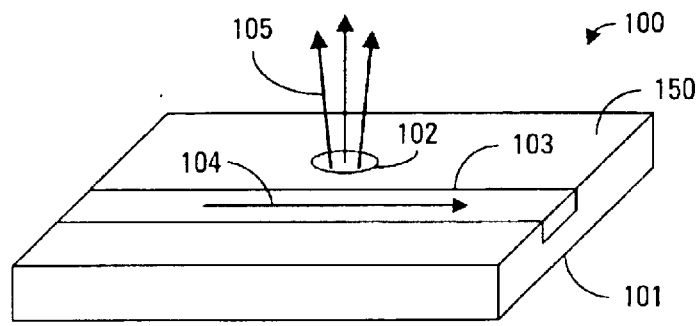
FIG. 1A is a schematic diagram illustrating a first embodiment of the coupled resonant cavity surface emitting laser (CRCSEL) of the invention.

FIG. 1A is a schematic diagram illustrating a first embodiment of a coupled resonant cavity surface emitting laser (CRCSEL) 100 according to the invention. An optically-resonant cavity 102 is located adjacent a single-mode optical gain structure 103 in a layer structure 101. The single-mode optical gain structure is configured to have a single resonant optical mode in the range of wavelengths in which it provides optical gain. The single optical mode is at the desired emission wavelength of CRCSEL 100. The single-mode optical gain structure typically includes an active region (not shown) that generates excitation light 104 in response to an external source of energy. The external source of energy is typically an electric current injected into the single-mode optical gain structure. The single-mode optical gain structure may alternatively be optically pumped. The excitation light generated by the single-mode optical gain structure propagates in the +/−x-direction shown. Associated with the excitation light is an evanescent field that propagates laterally to the single-mode optical gain structure, i.e., orthogonally to the x-direction. Single-mode optical gain structure 103 will be described in further detail below.

Optically-resonant cavity 102 is structured to be optically resonant at the wavelength of excitation light 104 generated by single-mode optical gain structure 103. The evanescent field couples part of the excitation light from the single-mode optical gain structure to the optically-resonant cavity. The optically-resonant cavity is asymmetrically structured to enable it to emit the excitation light received from the single-mode optical gain structure preferentially in a direction substantially orthogonal to the major surface 150 of layer structure 101 as output light beam 105. The output light beam has the same wavelength as the excitation light, but is lower in intensity.

Single-mode optical gain structure 103 differs from a conventional edge-emitting laser in that it has a single optical mode. The single optical mode is at the desired emission wavelength of CRCSEL 100. If a conventional edge-emitting laser were substituted for single-mode optical gain structure 103, and the end facets of the edge-emitting laser were optically coated to increase their reflectivity to a point where the dominant energy loss from the edge-emitting laser was through coupling to optically-resonant cavity 102, the edge-emitting laser would have its highest energy loss at the resonance wavelength of optically-resonant cavity 102. Consequently, the edge-emitting laser would not be capable of lasing at the desired emission wavelength. Single-mode optical gain structure 103 is configured to have a single optical mode at the resonance wavelength of the optically-resonant cavity. The single-mode optical gain structure having its maximum optical gain at the resonance wavelength of the optically-resonant cavity ensures that the single-mode optical gain structure will lase at this wavelength notwithstanding the loss of part of the excitation light to the optically-resonant cavity 102.

Figure 1B:
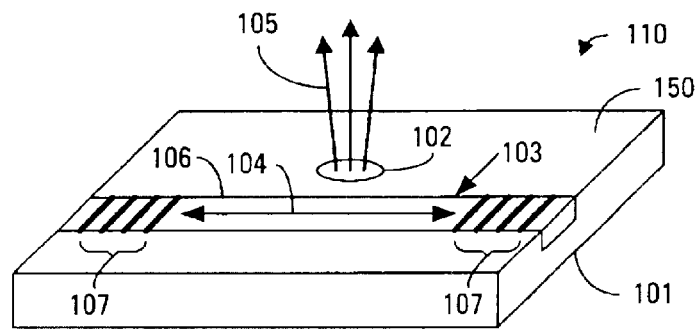
FIG. 1B is a schematic diagram illustrating a second embodiment of the CRCSEL of the invention.

FIG. 1B is a schematic diagram illustrating a second embodiment 110 of a CRCSEL according to the invention in which the single-mode optical gain structure 103 includes an in-plane optical waveguide 106 incorporating an active region (not shown) that generates excitation light 104. One-dimensional (1-D) distributed Bragg reflectors (DBRs) 107 spaced from one another along the length of the waveguide impose a single optical mode on the waveguide. The DBRs have their peak reflectivity at the desired emission wavelength of the CRCSEL and are spaced apart from one another along the length of the waveguide by an integral multiple of the desired emission wavelength in the material of the waveguide.

Optically-resonant cavity 102 is resonant at the desired emission wavelength of CRCSEL 110 and is located in the evanescent field surrounding waveguide 106. The optically-resonant cavity emits output light beam 105 in a direction substantially orthogonal to the major surface 150 of layer structure 101. The operation of the CRCSEL 110 is similar to that described above with reference to FIG. 1A.

Figure 1C:
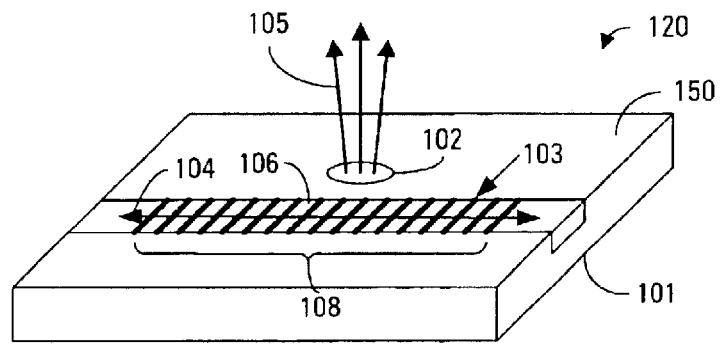
FIG. 1C is a schematic diagram illustrating a third embodiment of the CRCSEL of the invention.

FIG. 1C is a schematic diagram illustrating a third embodiment 120 of a CRCSEL according to the invention in which single-mode optical gain structure 103 includes an in-plane optical waveguide 106 incorporating an active region (not shown) that provides optical gain. Grating 108 located in or adjacent the waveguide and extending at least part-way along the length of the waveguide imposes a single optical mode on the waveguide. The combination of a waveguide incorporating an active region and a grating is known in the art as a distributed feedback (DFB) laser.

Optically-resonant cavity 102 is resonant at the desired emission wavelength of CRCSEL 120 and is located in the evanescent field surrounding waveguide 106. The optically-resonant cavity emits output light beam 105 in a direction substantially orthogonal to the major surface 150 of layer structure 101. The operation of the CRCSEL 120 is similar to that described above with reference to FIG. 1A.

Figure 1D:
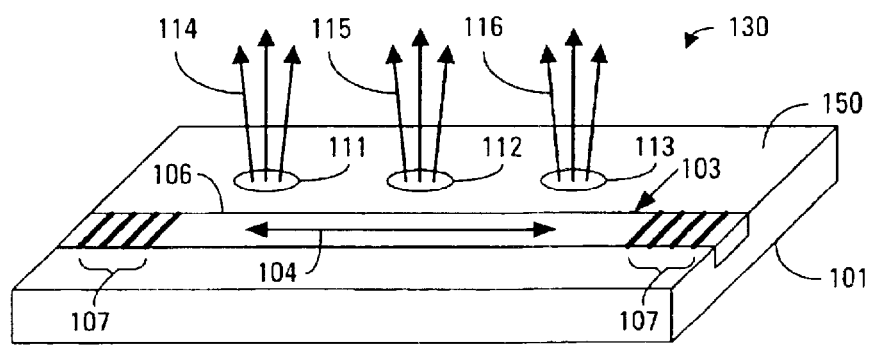
FIG. 1D is a schematic diagram illustrating a fourth embodiment of the CRCSEL of the invention.

FIG. 1D is a schematic diagram illustrating a fourth embodiment 130 of a CRCSEL according to the invention in which three separate optically-resonant cavities 111, 112 and 113 are located spaced from one another along the length of waveguide 106 in the evanescent field surrounding the waveguide. At least one of the optically-resonant cavities may be located on the opposite side of the waveguide from the others. The optically-resonant cavities each receive part of excitation light 104 generated by single-mode optical gain structure 103 and emit the excitation light in a direction substantially orthogonal to major surface 150 of layer structure 101 as output light beams 114, 115 and 116. Output light beams 114, 115 and 116 are emitted parallel to one another and spaced from one another along the length of the waveguide. Emitting multiple output light beams is difficult, if not impossible with the VCSELs or edge-emitting lasers discussed above. The intensity of each of the output light beams is significantly lower than that of the output light beam 105 emitted by the CRCSELs described above with reference to FIGS. 1A–1C as the excitation light received from single-mode optical gain structure 103 is shared among the output light beams. Moreover, the output light beams need not necessarily be equal in intensity due to variations in the coupling between the single-mode optical gain structure and the optically-resonant cavities 111, 112 and 113.

In the exemplary embodiments shown in FIGS. 1A–1D, the optically-resonant cavity 102 is located beside the single-mode optical gain structure 103 and is spaced from the single-mode optical gain structure by a distance of less than about one-half of the wavelength of excitation light 104 in the material of layer structure 101. Reducing the spacing between the optically-resonant cavity and the single-mode optical gain structure increases the threshold current of the CRCSEL. Increasing the spacing to a value above the stated range reduces the intensity of the emitted light beam(s) 105 or 114–116. In a manner analogous to conventional lasers having an optimum mirror reflectivity at which the efficiency of the laser is a maximum, CRCSELs have an optimum spacing of the optically-resonant cavity from the single-mode optical gain structure at which the efficiency of the CRCSEL is a maximum.

Figure 2:
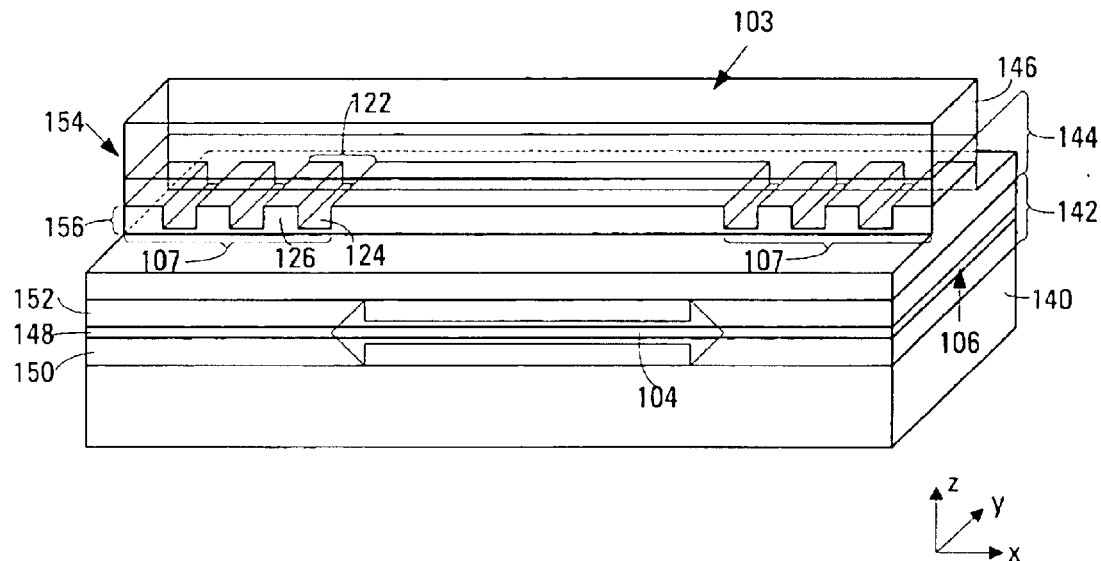
FIG. 2 is a schematic diagram showing details of the single-mode optical gain structure of the embodiment shown in FIG. 1B.

Single-mode optical gain structures based on optical waveguides incorporating one-dimensional DBRs or distributed feedback structures are generally known in the art. However, a short overview will be provided to further understanding of the invention. FIG. 2 is a schematic diagram showing an example of a single-mode optical gain structure in which optical waveguide 106 incorporates two one-dimensional DBRs 107 separated from one another along its length. In this example, layer structure 101 is composed of a substrate (not shown) on which are located, in order, a substrate-side cladding layer 140, an active region 142, a remote-side cladding layer 144 and a cap layer 146. The active region is composed of quantum well heterostructure 148 sandwiched between substrate-side waveguide layer 150 and remote-side waveguide layer 152. The waveguide layers are layers of a material having a refractive index greater than that of the material of cladding layers 140 and 144. The refractive index contrast between the materials of the waveguide layers and the cladding layers provides confinement in the +/−z-direction of excitation light 104 generated in quantum well heterostructure 148. The extent of cap layer 146 and part of remote-side cladding layer 144 is reduced in the +/−z-direction to form ridge structure 154 that provides lateral confinement of the excitation light, i.e., confinement in the +/−z-direction. Lateral confinement structures different from ridge structure 154 may alternatively be used.

Active region 142 constitutes the core of waveguide 106. Cladding layers 140 and 144 and ridge structure 154 collectively constitute the cladding of waveguide 106. Waveguide 106 may have a structure different from that exemplified.

Remote-side cladding layer 144 includes a contrast layer 156 of a material having a higher refractive index than the material of the remainder of cladding layer 144. The surface of the contrast layer is castellated in the regions from one another along the length of waveguide 106 where one-dimensional DBRs 107 are located. In the castellated regions, the refractive index contrast between the material of the contrast layer and the material of the cladding layer form reflector elements. Each of the DBRs is composed of a number of the reflector elements arrayed in the x-direction. An exemplary reflector element is shown at 122. Each reflector element comprises a pair of adjacent elements of materials having different refractive indices. Exemplary reflector element 122 is composed of low-index element 124 of the material of cladding layer 144 and high-index element 126 of the material of contrast layer 156. Elements 124 and 126 each have a dimension in the x-direction equal to one-quarter of the wavelength of excitation light 104 in the material of the element. The remaining reflector elements are similarly structured.

The reflector elements are formed by etching or otherwise forming transverse channels in contrast layer 156 to form castellated regions separated from one another along the length of waveguide 106. The remainder of cladding layer 144 is then grown on the etched contrast layer. The channels extend in the y-direction, i.e., orthogonally to the length of the waveguide. In another example, the contrast layer is omitted and the reflector elements are formed by selectively introducing a refractive index changing dopant doping the material of cladding layer 144 in regions corresponding to the above-described channels with. The doping may be performed after the cladding layer has been grown part-way to locate the DBRs closer to the active region. The reflector elements may be formed using methods different from those just exemplified.

Active region 142 generates light in response an external source of energy, typically electrical energy or light energy. For example, substrate-side cladding layer 140 may be a layer of n-type semiconductor material, the active region may be composed of undoped semiconductor material, and remote-side cladding layer may be a layer of p-type semiconductor material. Electric current passing though these layers generates excitation light 104 by the recombination of electrons and holes in quantum well heterostructure layer 148 that constitutes part of the active region. In another example, the active region may be composed of layers of undoped semiconductor materials in which excitation light 104 is generated by illuminating the active region with light having a wavelength shorter than that of the excitation light.

Figure 3:
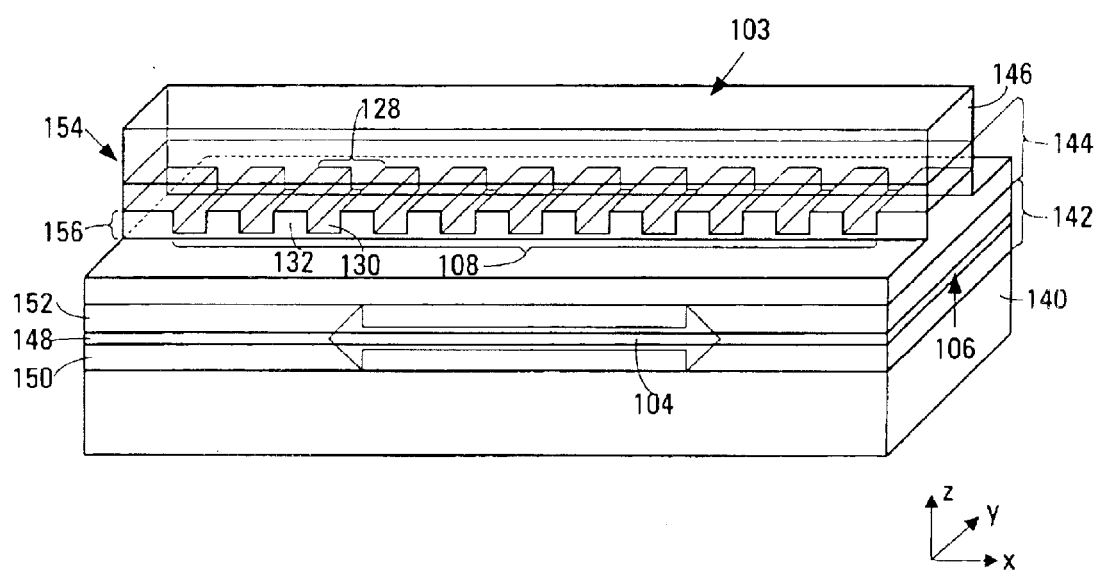
FIG. 3 is a schematic diagram showing details of the single-mode optical gain structure of the embodiment shown in FIG. 1C.

FIG. 3 is a schematic diagram showing an example of a DFB single-mode optical gain structure in which optical waveguide 106 incorporates grating 108 disposed along its length. Elements of the single-mode optical gain structure shown in FIG. 3 that correspond to the single-mode optical gain structure shown in FIG. 2 are indicated using the same reference numerals and will not be described again here. Waveguide 106 is located in layer structure 101 and has a structure similar to that described above with reference to FIG. 2. Remote-side cladding layer 144 includes contrast layer 156 that has a castellated surface that extends at least part-way along the length of the waveguide. The castellated surface and the refractive index contrast between the materials of the contrast layer and cladding layer 144 at the castellated surface constitute grating 108. The grating is structured to be resonant at the desired wavelength of excitation light 104 and therefore confers a single mode characteristic on the waveguide at the desired wavelength of the excitation light.

In the example shown, grating 108 is composed of grating elements arrayed along the length of waveguide 106. An exemplary grating element is shown at 128. Each grating element comprises a pair of adjacent elements of materials having different refractive indices. Exemplary grating element 128 is composed of low-index element 130 of the material of cladding layer 144 and high-index element 132 of the material of contrast layer 156. The grating element has a dimension in the x-direction equal to one-half of the desired wavelength of excitation light 104 in the materials of the element. The remaining grating elements are similarly structured.

The grating elements may be formed in a manner similar to the reflective elements described above with reference to FIG. 2.

Single-mode optical gain structure structures other than those just exemplified can be used as single-mode optical gain structure 103. A cleaved-coupled-cavity ($C^3$) laser structure and a short-cavity laser structure can both be structured to have a narrow optical gain versus wavelength characteristic centered at a defined wavelength.

Figure 4:
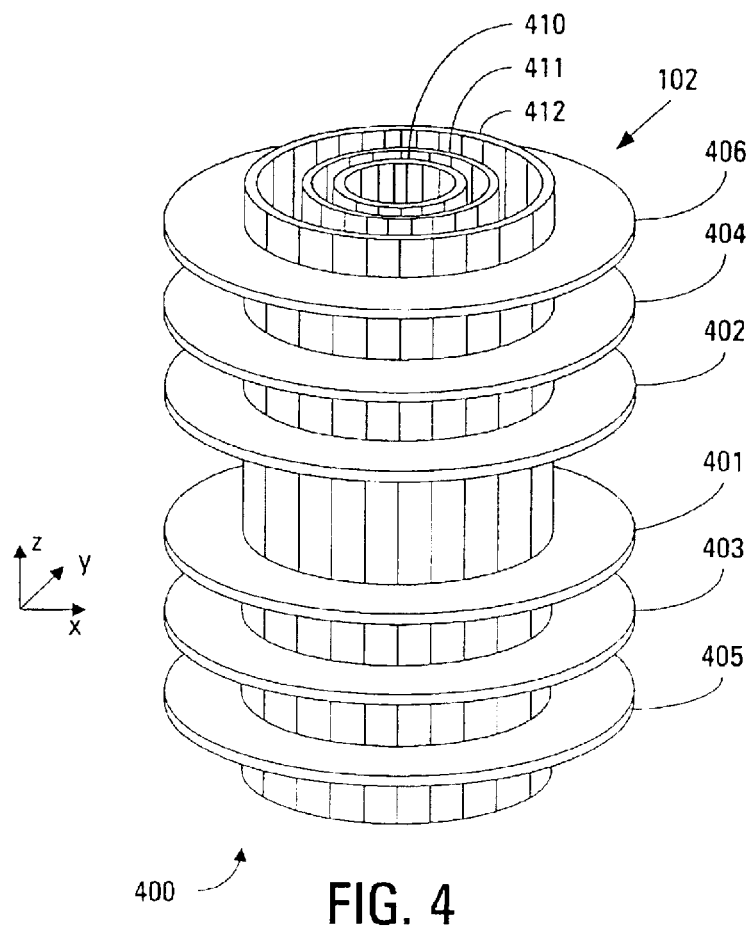
FIG. 4 is a schematic diagram of the cavity-defining structure of a symmetrical embodiment of the optically-resonant cavity of FIGS. 1A–1D.

The optically-resonant cavity 102 will now be described in more detail with reference to FIGS. 4, 5 and 6, and with additional reference to FIG. 1A. FIG. 4 is a schematic diagram showing an exemplary cavity-defining structure 400 of an axially-symmetrical embodiment of optically-resonant cavity 102. The optically-resonant cavity is composed of the cavity-defining structure and fill material that fills the interstices of the cavity-defining structure.

Cavity-defining structure 400 is shown in free space in FIG. 4. Typically, however, the cavity-defining structure is embedded in an embedding material that constitutes at least one layer of layer structure 101 so that the cavity-defining structure is embedded in the embedding material and the embedding material additionally constitutes the fill material that fills the interstices between the reflective plates and reflective cylinders. Alternatively, the cavity-defining structure may be embedded in the embedding material but the interstices may be filled with fill material different from the embedding material. In the context of this disclosure, interstices that are evacuated are regarded as being "filled" with a vacuum.

Cavity-defining structure 400 constitutes at least part of an embodiment of optically-resonant cavity 102 having radiation pattern that is both axially-symmetrical and radially-symmetrical. Such embodiment receives part of excitation light 104 from single-mode optical gain structure 103, emits a fraction of the received excitation light axially in a symmetrical radiation pattern that extends in both the +z-direction and the −z-direction and emits the remainder of the received excitation light in a radially-symmetrical radiation pattern. The distribution of the received excitation light between the axial radiation pattern and the radial radiation pattern depends on the structure of the cavity-defining structure, as will be described below.

Cavity-defining structure 400 is composed of reflective plates 401, 402, 403, 404, 405 and 406 and reflective cylinders 410, 411 and 412. The numbers of reflective plates and reflective cylinders are exemplary, and cavity-defining structure 400 may be composed of numbers of reflective plates and reflective cylinders different from those shown. The reflective cylinders are arranged concentrically with their axes of rotational symmetry oriented in the z-direction. The reflective plates are arranged parallel to one another with their major surfaces parallel to the x-y plane. The reflective plates are arrayed in the z-direction along the length of, and overlapping, the reflective cylinders. Pairs of the reflective plates are symmetrically disposed about the axial mid-point of the reflective cylinders. In the example shown, relative to the axial mid-point of the reflective cylinders, three of the reflective plates, 401, 403 and 405 are located in the −z-direction and three of the reflective plates 402, 404 and 406 are located in the +z-direction.

Reflective plates 401–406 and reflective cylinders 410–412 are dimensioned and spaced from one another to make an optically-resonant cavity that incorporates cavity-defining structure 400 that is optically resonant at nominally the same wavelength as single-mode optical gain structure 103. However, the resonant wavelength of the optically-resonant cavity may differ from the resonant wavelength of the single-mode optical gain structure in a working CRC-SEL. The maximum difference in the resonant wavelengths depends on the quality factor (Q) of the optically-resonant cavity.

Figure 5:
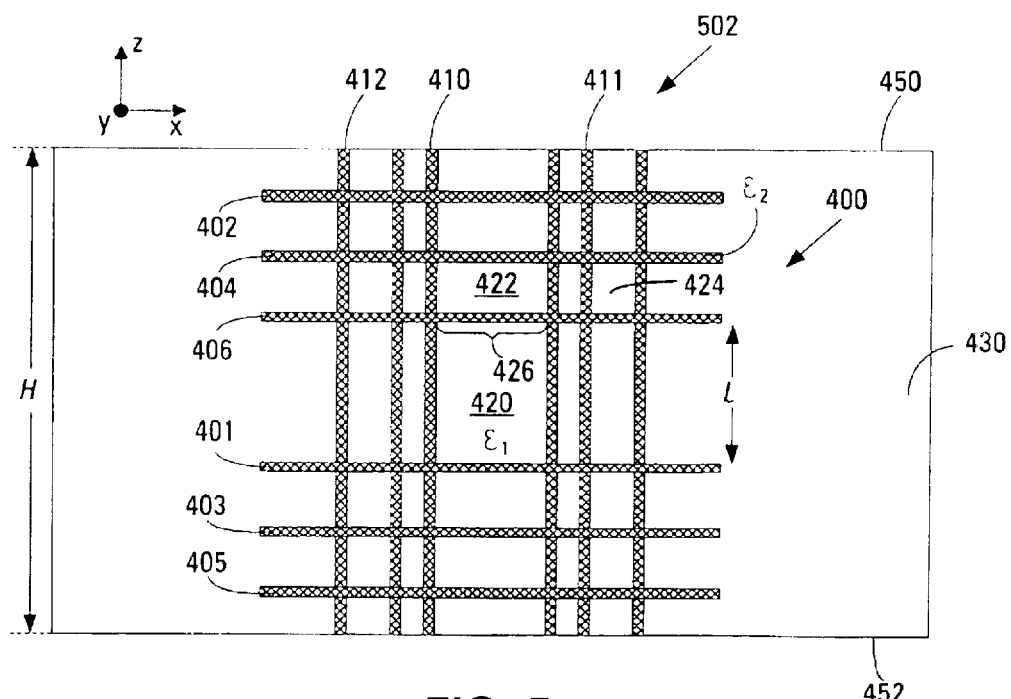
FIG. 5 is a cross-sectional view of an embodiment of the optically-resonant cavity composed of the symmetrical embodiment of the cavity-defining structure shown in FIG. 4 embedded in an embedding material.

FIG. 5 shows a cross-sectional view of an exemplary embodiment 502 of optically-resonant cavity 102. Optically-resonant cavity 502 is composed of cavity-defining structure 400 embedded in embedding material 430. The major surface 450 of the embedding material defines the x-y plane shown in FIG. 5.

Cavity-defining structure 400 is embedded in embedding material 430 with the major surfaces of reflective plates 401–406 parallel to the x-y plane and with the axes of rotational symmetry of reflective cylinders 410–412 aligned in the z-direction. Each of the reflective plates partially reflects light in the z-direction, orthogonal to the x-y plane. Each of the reflective cylinders 410–412 partially reflects light in the radial direction of the cylinders, parallel to the x-y plane.

Reflective plates 401–406 and reflective cylinders 410–412 collectively define a number of interstices. The interstices include cylindrical central cavity 420, exemplary cylindrical interstice 422 and exemplary annular interstice 424. The interstices defined by reflective plates 401–406 and reflective cylinders 410–412 are filled with fill material. The following description refers to an example in which embedding material 430 constitutes the fill material. Alternatively, the fill material may be a gas, such as air, or a solid or liquid material different from embedding material 430. The fill material may additionally be a vacuum, as noted above. For embodiments in which the interstices are filled with a fill material different from the embedding material, the description below should be read with "fill material" substituted for "embedding material" when referring to the material that fills the interstices. The following example additionally refers to an example in which the embedding material is a solid material that constitutes part of layer structure 101. However, this is not critical to the invention. The embedding material may be another solid, liquid or gaseous material, or may be free space.

Embedding material 430 has a dielectric constant $\in_1$ different from the dielectric constant $\in_2$ of the material of the cavity-defining structure 400. However, the embedding material and the material of the cavity-defining structure are not limited to conventional dielectric materials. Metals and semiconductors can also be regarded as having a dielectric constant.

Typically, reflective plates 401–406 and reflective cylinders 410–412 are all formed of the same material, which will be called the cavity-defining structure material. Alternatively, the reflective plates and the reflective cylinders may be made of different materials.

Exemplary combinations of the cavity-defining structure material of cavity-defining structure 400 and embedding material 430 include aluminum arsenide (AlAs) and gallium arsenide (GaAs), indium gallium arsenide phosphide (InGaAsP) and indium phosphide (InP), and silicon (Si) and silicon dioxide ($SiO_2$), respectively. In embodiments in which the interstices collectively defined by reflective plates 401–406 and reflective cylinders 410–412 are filled with a fill material different from embedding material 430, the embedding material may be the cavity-defining structure material.

In the material combinations just exemplified, the material of cavity-defining structure 400 has a dielectric constant greater than that of embedding material 430. This is not critical to the invention. The material of the cavity-defining structure may have a dielectric constant less than that of the embedding material. In this case, the phase reversals resulting from such a combination of materials modifies some of the design rules set forth below. Many other pairs of materials can be used to form optically-resonant cavity 502 and the invention is not limited to the materials exemplified above. Materials having a large difference in dielectric constant reduce the number of reflective plate pairs and reflective cylinders needed to provide a given quality factor ($Q_T$). The materials should each have a bandgap energy greater than the quantum energy of excitation light 104 to prevent them from absorbing the excitation light.

Optically-resonant cavity 502 that includes cavity-defining structure 400 composed of reflective plates 401–406 and reflective cylinders 410–412 is resonant at certain optical wavelengths. The wavelengths at which the optically-resonant cavity is resonant depend on the dimensions of the cavity-defining structure, the material of the cavity-defining structure and embedding material 430, as will be described in more detail below.

Optically-resonant cavity 502 can generally be described as an out-of-plane coupler structured to redirect light, and, more specifically, as a cylindrical three dimensional (3-D) distributed Bragg reflector. Optically-resonant cavity may alternatively be a spherical three-dimensional distributed Bragg reflector. The optically-resonant characteristics of optically-resonant cavity 502 enable the optically-resonant cavity to absorb and re-emit part of excitation light 104 generated by single-mode optical gain structure 103.

In one example of optically-resonant cavity 502 structured in accordance with the design rules that will be described below, cavity-defining structure 400 is composed of three concentric reflective cylinders 410–412 and six parallel reflective plates 401–406 arranged as described above. The reflective cylinders are shown as projecting axially beyond the outermost pair of reflective plates 405 and 406 and the reflective plates are shown as projecting radially beyond the outermost reflective cylinder 412. However, this is not critical to the invention. The reflective cylinders may end at the outermost pair of reflective plates 405 and 406 and the reflective plates may end at the outermost reflective cylinder 412. An optically-resonant cavity incorporating a cavity-defining structure structured as just described will have characteristics slightly different from those of optically-resonant cavity 502.

Reflective plates 401–406 and reflective cylinders 410–412 are made of silicon ($\in$=11.56), and are embedded in embedding material 430 of silicon dioxide ($\in$=2.25). In an embodiment resonant at a wavelength of 1.55 $\mu$m, inner reflective cylinder 410 has an inside radius of 1.140 $\mu$m, and an outside radius of 1.265 $\mu$m. Middle reflective cylinder 411 has an inside radius of 1.737 $\mu$m and an outside radius of 1.860 $\mu$m. Finally, outer cylinder 412 has an inside radius of 2.329 $\mu$m and an outside radius of 2.452 $\mu$m. The reflective cylinders differ in thickness because the radial wave is defined by a Bessel function.

Each of reflective plates 401–406 has a thickness of 117.5 nm. Adjacent ones of the reflective plates, except for reflective plates 401 and 402, are separated from one another along the length of the reflective cylinders by a distance of 310 nm. Dielectric plates 401 and 402 are separated by a distance of 620 nm. The inside surfaces of dielectric plates 401 and 402 and inner cylinder 410 collectively define central cavity 420. Thus, in this exemplary embodiment resonant at a wavelength of 1.55 $\mu$m, the central cavity has a height of 620 nm and a radius of 1.140 $\mu$m.

Optically-resonant cavity 502 has an axially-symmetrical radiation pattern. The optically-resonant cavity receives part of the excitation light 104 from single-mode optical gain structure 103 and emits a fraction of the received excitation light in both the +z-direction and the −z-direction in an axially-symmetrical radiation pattern. The optically-resonant cavity emits the remainder of the received excitation light into embedding material 430 in a symmetrical radial radiation pattern. The radiation pattern can be altered by changing the structure of the optically-resonant cavity 502 from that shown. For example, a optically-resonant cavity having an axially-asymmetrical radiation pattern would incorporate an axially-asymmetrical cavity-defining structure and would preferentially emit the received excitation light in the +z-direction as output light beam 105.

Figure 6:
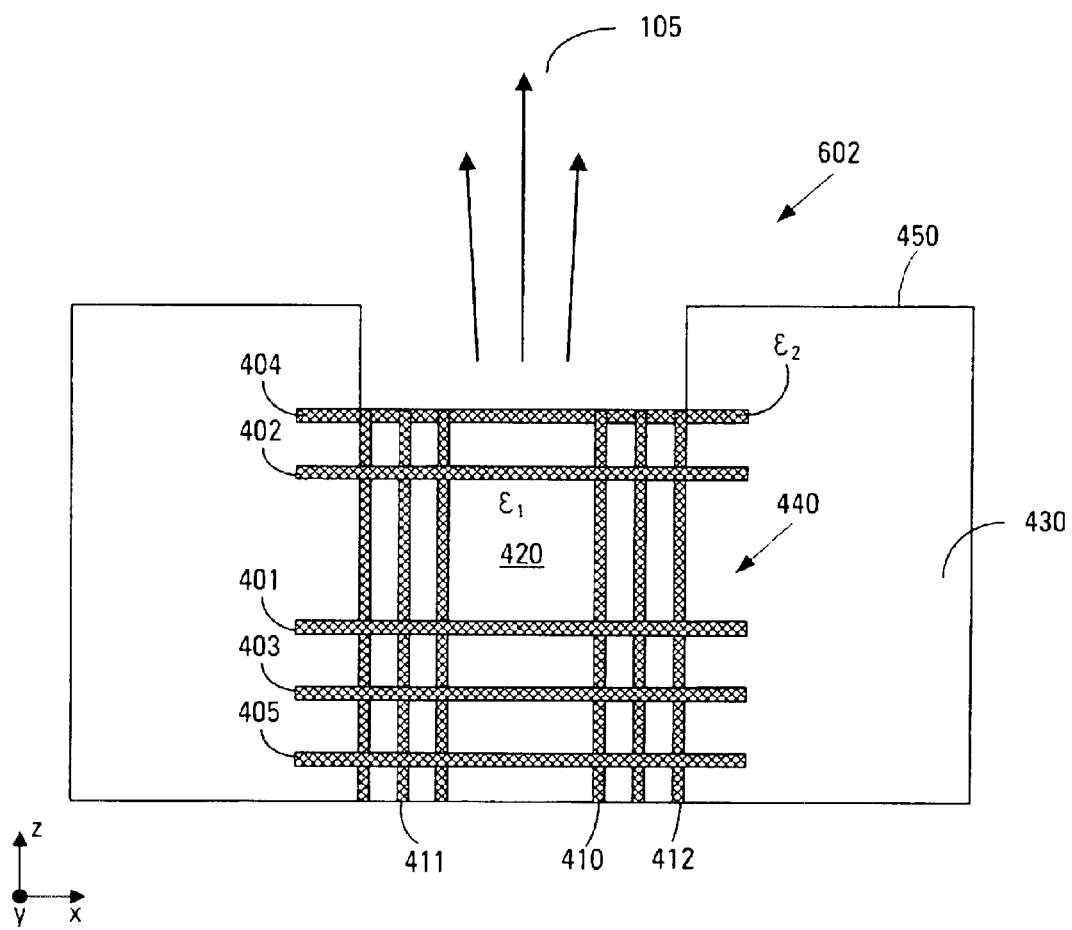
FIG. 6 is a cross-sectional view of an embodiment of the optically-resonant cavity composed of an asymmetrical embodiment of the cavity-defining structure embedded in embedding material.

FIG. 6 shows a schematic cross-sectional view of an exemplary embodiment 602 of optically-resonant cavity 102. Optically-resonant cavity 602 is composed of an axially-asymmetrical cavity-defining structure 440 embedded in embedding material 430. The embedding material constitutes part of layer structure 101 in the example shown. The axially-asymmetrical cavity-defining structure gives optically-resonant cavity 602 an axially-asymmetrical radiation pattern in which output light beam 105 is preferentially emitted in the +z-direction.

Cavity-defining structure 440 is composed of reflective plates 401, 402, 403, 404 and 405 and reflective cylinders 410, 411 and 412. The reflective cylinders are arranged concentrically with their axes of rotational symmetry oriented in the z-direction. The reflective plates are arranged parallel to one another with their major surfaces parallel to the x-y plane. The reflective plates are arrayed in the z-direction along the length of, and overlapping, the reflective cylinders. As noted above, the reflective plates need not project beyond the outermost reflective cylinders and the reflective cylinders need not project beyond the outermost reflective pairs. The reflective plates are asymmetrically disposed about the axial mid-point of the reflective cylinders. In the example shown, relative to the axial mid-point of the reflective cylinders, three of the reflective plates, 401, 403 and 405, are located in the −z-direction and two of the reflective plates, 402 and 404, are located in the +z-direction. The outer surface of reflective plate 404 may be flush with major surface 450 instead of being recessed as shown.

Reflective plates 401–405 and reflective cylinders 410–412 are dimensioned and spaced from one another to make optically-resonant cavity 602 optically resonant at substantially the same wavelength as single-mode optical gain structure 103.

The relationship between the number of reflective plates and the number of reflective cylinders in the cavity-defining structures 400 and 440 described above is a major factor in determining the radiation pattern of the light emitted by optically-resonant cavities 502 and 602, respectively. The number of reflective cylinders exceeding the number of pairs of reflective plates promotes axial radiation over radial radiation. Such a cavity-defining structure provides better optical containment in the radial direction than in the axial direction. A cavity-defining structure in which there are equal numbers of reflective plates on opposite sides of central cavity 420 will have an axially-symmetrical radiation pattern in which light is emitted in both the +z-direction from the major surface 450 of the layer structure and the −z-direction from the bottom of the layer structure. A cavity-defining structure in which the numbers of reflective plates on opposite sides of central cavity 420 are not equal will have an axially-asymmetrical radiation pattern in which the optically-resonant cavity emits output light beam 105 preferentially in the +z-direction or the −z-direction depending on the direction in which the smaller number of reflective plates is located. The aspect ratio (i.e., ratio of radius to length) of central cavity 420 is another major factor in determining the radiation pattern of the optically-resonant cavities. A large aspect ratio promotes axial emission over radial emission.

In the embodiments of the coupled resonant cavity surface-emitting laser described above with reference to FIGS. 1A–1D, optically-resonant cavity 602 incorporating the cavity-defining structure 440, as shown in FIG. 6, is used as the optically-resonant cavity 102. The CRCSEL is composed of cavity-defining structure 602 and single-mode optical gain structure 103 embedded in embedding material 430. Optically-resonant cavity 602 has a high quality factor (Q) at a wavelength substantially equal to the wavelength of excitation light 104 generated by the single-mode optical gain structure. An evanescent field created by excitation light 104 extends outside the core of waveguide 106 that forms part of single-mode optical gain structure 103. The optically-resonant cavity is located in the evanescent field and part of the excitation light is coupled into the optically-resonant cavity by the evanescent field.

Optically-resonant cavity 602 incorporates cavity-defining structure 440 that causes the optically-resonant cavity to emit output light beam 105 preferentially in a direction orthogonal to the major surface 450 of embedding material 430. The direction of the output light beam is also orthogonal to the direction in which excitation light 104 propagates through waveguide 106 that forms part of single-mode optical gain structure 103. Part of the excitation light can be coupled from the single-mode optical gain structure to the central cavity 420 of the cavity-defining structure by appropriately configuring the single-mode optical gain structure, the optically-resonant cavity and their relative placement in the substrate, as will be described in detail below. In general, the number of periods of the reflective elements, i.e., reflective cylinders and pairs of reflective plates, in the cavity-defining structure is chosen to achieve a compromise between achieving adequate coupling between optically-resonant cavity 602 and the single-mode optical gain structure 103 and providing optically-resonant cavity with an adequate Q factor. Emission of output light beam 105 is the dominant light energy loss mechanism for optically-resonant cavity 602.

The CRCSEL of the invention has advantages over other types of semi-conductor laser in many applications. In general, a CRCSEL can be the preferred laser structure for use in any application that requires any one or more of the following features:

(1) emission of coherent light from the major surface of a substrate;

(2) a cylindrical mode shape well-matched to a single-mode fiber;

(3) the ability to perform on-wafer testing;

(4) the ability to generate multiple output light beams from a single energy input (electrical or optical);

(5) high single-mode output power due to the relatively large volume of the single-mode optical gain structure waveguide that provides optical amplification; and (5) high single-pass optical gain due to the relatively long length of the single-mode optical gain structure.

VCSELs and CRCSELs share features (1), (2) and (3) while edge-emitting lasers and CRCSELs share features (5) and (6). Applications that require features from both subsets or that require the unique property of feature (4) are the singular domain of CRCSELs.

Figure 7:
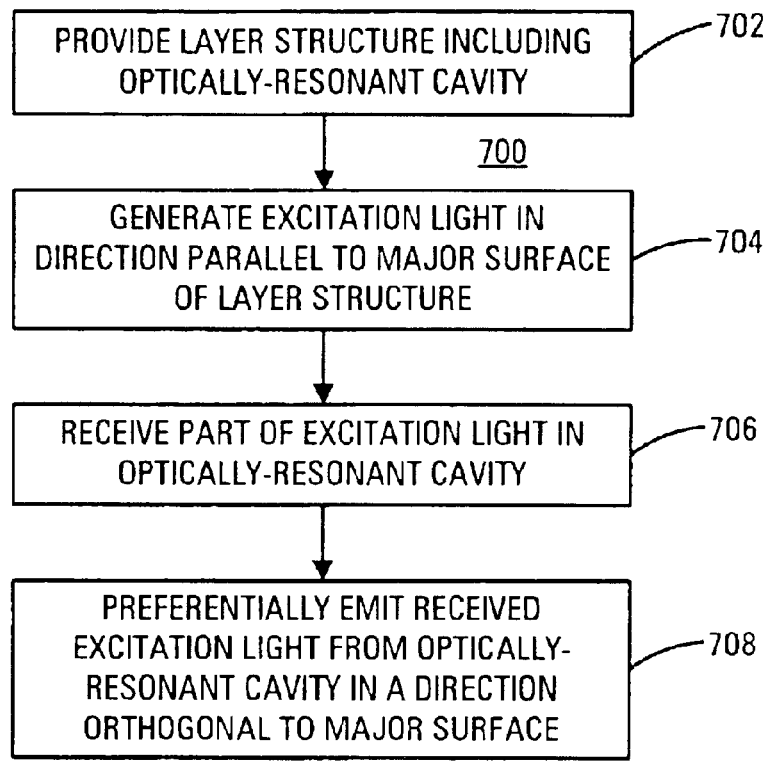
FIG. 7 is a flowchart illustrating a method according to the invention for generating light.

FIG. 7 is a flow chart illustrating an embodiment 700 of a method according to the invention for generating coherent light. In block 702, a substrate that includes an optically-resonant cavity is provided. In block 704, excitation light having a single optical mode is generated in a direction parallel to a major surface of the substrate. In block 706, part of the excitation light is received in the optically-resonant cavity. In block 708, the received excitation light is preferentially emitted by the optically-resonant cavity in a direction orthogonal to the major surface of the substrate.

Figure 8:
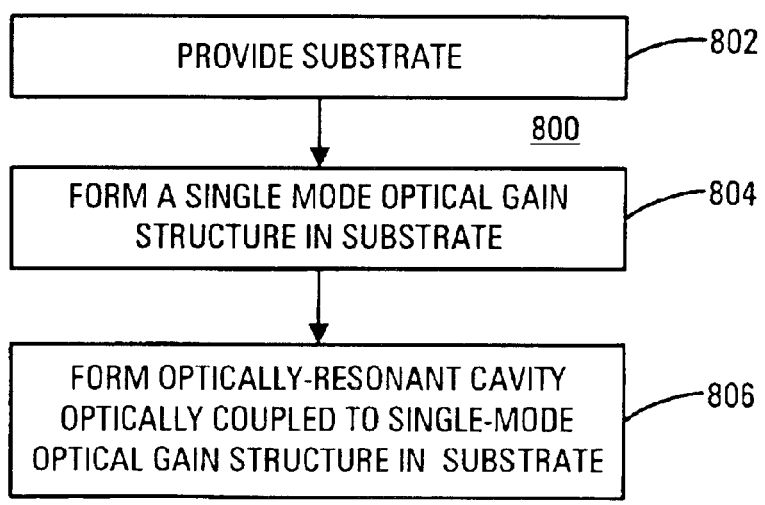
FIG. 8 is a flowchart illustrating a method according to the invention for making a surface-emitting laser.

FIG. 8 is a flowchart illustrating an embodiment 800 of an exemplary method for making a surface-emitting laser in accordance with to the invention. In block 802, a substrate is provided. In block 804, a single-mode optical gain structure is formed on the substrate. In block 806, an optically-resonant cavity optically coupled to the single-mode optical gain structure is formed on the substrate. The optically resonant cavity is optically resonant at substantially the same wavelength as that of the single mode of the single-mode optical gain medium.

In block 804, the single-mode optical gain structure is fabricated by epitaxially growing layers of different semi-conductor materials on the major surface of the substrate to form a layer structure in which the single-mode optical gain structure is located. The semiconductor materials are typically group III–V semiconductor materials. The layers include a p-i-n double heterostructure composed of an undoped active region sandwiched between two cladding layers. The materials of the cladding layers have a lower refractive index than that of the materials of the active layer adjacent the cladding layers and are doped n-type and p-type respectively. The active layer typically includes a quantum well heterostructure composed of one or more quantum well layers sandwiched between a corresponding number of barrier layers. The active layer sandwiched between the cladding layers of a material having a lower refractive index constitutes an optical confinement structure that confines light to the active layer. The single-mode optical gain structure is further processed to form a lateral confinement structure. For example, the layers may be selectively etched to form a ridge structure that provides lateral confinement. The confinement structures collectively define a long, narrow waveguide that includes part of the active layer. The excitation light generated in the active layer is confined to the waveguide.

The single-mode optical gain structure includes elements that reflect light traveling along the waveguide back into the waveguide. Such elements may be located, for example, in one of the cladding layers. The elements establish the single optical mode of the single-mode optical gain structure and cause the single-mode optical gain structure to generate coherent light. In a single-mode optical gain structure structured as a DBR laser, as shown in FIG. 2, the elements are sets of reflective elements located at opposite ends of the waveguide that forms part of the single-mode optical gain structure. In a single-mode optical gain structure structured as a DFB laser, as shown in FIG. 3, the elements are grating elements located periodically along the length of the waveguide. In either of these cases, the size of the elements and the spacing between adjacent ones of them determine the wavelength of the light generated by the single-mode optical gain structure. The elements may be formed by etching, for example. Processes suitable for forming single-mode optical gain structures on a substrate are known in the art and will therefore not be described in more detail.

In block 806, the optically-resonant cavity is fabricated during the process of epitaxially growing the above-mentioned layer structure in which the single-mode optical gain structure is located. A first example of the fabrication of a simplified embodiment of optically-resonant cavity 602 in block 806 will now be described with additional reference to FIG. 6. The embodiment is simplified in that reflective cylinders 410–412 do not project axially beyond reflective plates 404 and 405. Fabrication starts with a substrate having a layer of embedding material located on its major surface. The layer of the embedding material typically constitutes at least part of one of the layers of layer structure 101 in which single-mode optical gain structure 103 is also fabricated. The layer of embedding material is selectively etched to define a circular cavity having the extent of reflective plate 405. A layer of cavity-defining structure material is deposited on the surface of the embedding material, including in the cavity, and is selectively etched to remove it except from in the cavity. Alternatively, the cavity-defining structure material may be selectively deposited in the cavity.

Another layer of the embedding material is deposited to a thickness equal to the distance between reflective plates 405 and 403. The layer of embedding material is selectively etched to define three annular cavities having the extent of the portions of reflective cylinders 410–412 that extend from reflective plate 405 to reflective plate 403. The cavities are then selectively filled with the cavity-defining structure material, as described above. The processes just described are then repeated to fabricate reflecting plates 403, 402, 402 and 404 and the portions of the reflective cylinders extending between reflecting plates 403 and 401, between reflecting plates 401 and 402 and between reflecting plates 402 and 404. Each of the selective etching processes described above typically uses a photolithographically-defined etch mask to protect the material that is not to be removed.

The optically-resonant cavity may alternatively be fabricated in a process that starts with a substrate having a layer of cavity-defining structure material located on its major surface. The layer of cavity-defining structure material typically constitutes at least part of one of the layers of layer structure 101 in which single-mode optical gain structure 103 is also fabricated. The layer of cavity-defining structure material is selectively etched to define reflective plate 405. A layer of embedding material is then deposited to cover the exposed surfaces of the layer structure and the reflective plate. The layer is planarized to expose the surface of the reflective plate. Another layer of cavity-defining structure material is then deposited to cover the surfaces of the reflective plate and the layer of the cavity-defining structure material. This layer has a thickness equal to the distance between reflective plates 405 and 403. The layer of the cavity-defining structure material is then selectively etched to define the portions of the reflective cylinders extending from reflective plate 405 to reflective plate 403. A layer of embedding material is then deposited to cover the exposed surfaces of the layer structure and the reflective cylinder portions and is planarized to expose the surfaces of the reflective cylinder portions. The processes just described are repeated to fabricate reflecting plates 403, 402, 402 and 404 and the portions of the reflective cylinders extending between reflecting plates 403 and 401, between reflecting plates 401 and 402 and between reflecting plates 402 and 404. Each of the selective etching processes described above typically uses a photolithographically-defined etch mask to protect the material that is not to be removed.

The fabrication processes described above are merely examples. Processes different from those exemplified may be used to fabricate either or both of the optically-resonant cavity and the single-mode optical gain structure.

Figure 9:
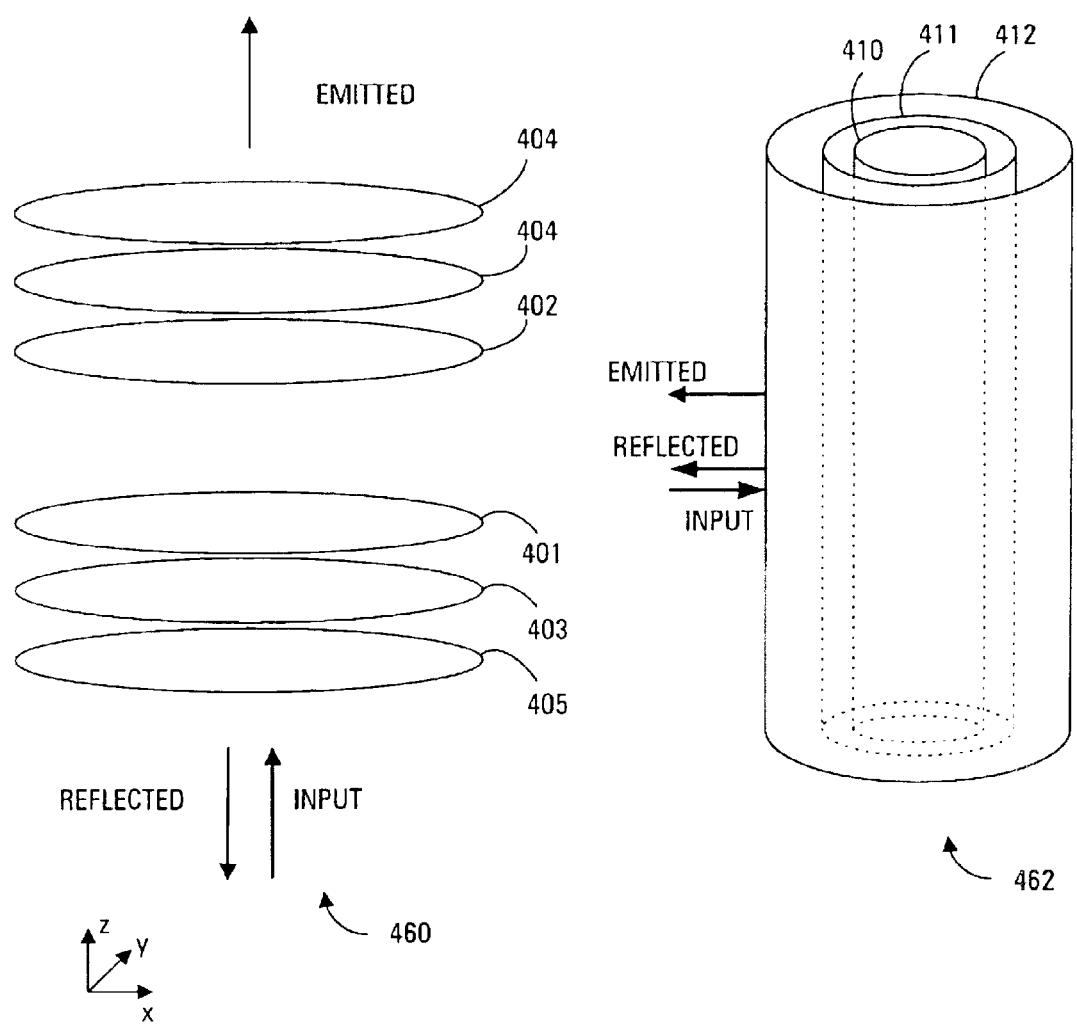
FIG. 9 is a perspective view illustrating the operation of the optically-resonant cavity shown in FIG. 4.

A mathematical analysis of optically-resonant cavity 502 shown in FIG. 5 incorporating axially-symmetrical cavity-defining structure 400 shown in FIG. 4 will now be described with reference to FIG. 9. Cavity-defining structure 400 can be regarded as being composed of an axial reflective structure 460 and a radial reflective structure 462.

Axial reflective structure 460 is composed of reflective plates 401–406 disposed parallel to one another and to the x-y plane. The reflective plates each partially reflect light in the z-direction, orthogonal to the x-y plane. Thus, the axial reflective structure can be regarded as a one-dimensional (1-D) distributed Bragg reflector.

Radial reflective structure 462 is composed of reflective cylinders 410–412 disposed concentrically with their axes of rotational symmetry oriented in the z-direction. The reflective cylinders each partially reflect light in the radial direction of the cylinders. Thus, the radial reflective structure can be regarded as a two-dimensional (2-D) distributed Bragg reflector.

A determination of whether axial reflective structure 460 and radial reflective structure 462 can work together in cavity-defining structure 400 without disrupting the coherent behavior of one another can be made by first writing down a wave equation describing the azimuthal electric field for the Transverse Electric (TE) mode of the cavity-defining structure:

$$\nabla^2 E_\phi(\rho,z) + k_o^2 \in_\perp(\rho,z) E_\phi(\rho,z) = 0 \qquad (1)$$

where $k_o$ is the free space k-vector for the wavelength of excitation light 104, $\rho$ is the radial distance (in the x-y plane) from the axis of rotational symmetry of the reflective cylinders, z is distance along the axis of rotational symmetry of the reflective cylinders, $E_\phi(\rho, z)$ is the electric field expressed in polar coordinates and $\in_\perp(\rho, z)$ is the relative dielectric constant of the material of cavity-defining structure 400. The relative dielectric constant is relative to the dielectric constant of free space $\in_0$. The relative dielectric constant $\in_\perp(\rho, z)$ is given by:

$$\in_{195}(\rho,z) = 1 + (\in_{\perp'} - 1)(f_1(\rho) + f_2(z) - f_1(\rho)f_2(z)) \qquad (2)$$

where:

$$f_1(\rho) = \begin{cases} 1 & \text{inside reflective cylinder} \\ 0 & \text{outside reflective cylinder} \end{cases} \qquad (3)$$

$$f_2(z) = \begin{cases} 1 & \text{inside reflective plate} \\ 0 & \text{outside reflective plate} \end{cases}$$

and $\in_{\perp'}$ is the constant value of the dielectric constant of the material of the cavity-defining structure. Equation (1) would be completely separable except for the last term in Equation (2) that describes the relative dielectric constant of the material of the cavity-defining structure. This term, proportional to $f_1(\rho)f_2(z)$, is required so that the dielectric constant is not double-counted in the regions where reflective plates 401–406 and reflective cylinders 410–412 intersect.

Equation (1) not being separable between the $\rho$ and z dimensions means that the set of reflective plates 401–406 constituting axial reflective structure 460 and the set of reflective cylinders 410–412 constituting radial reflective structure 462 do not act independently. Thus, in general, a one-dimensional DBR and a two-dimensional DBR cannot be simply combined to create a three-dimensional DBR.

However, with an appropriate choice of mode, separability can be restored with a high level of accuracy. The appropriate mode is the $TE_0$ resonant mode, which has nulls in the electric field at the inner surfaces of all reflective plates 401–406 and all reflective cylinders 410–412 when coherent design rules for the optically-resonant cavity are followed. An inner surface of a reflective plate or a reflective cylinder is the major surface of the reflective plate or the reflective cylinder that is closer to central cavity 420. Separability is restored when the electric field values experience a double-null, i.e., a null in each of the $\rho$ and z dimensions, at the regions where the reflective plates and the reflective cylinders intersect. This allows the non-separable term to be deleted from the equation. Perturbative techniques show that the numerical error associated with this approximation is extremely small.

The above equations describe cavity-defining structure 400 in free space. To calculate the resonant modes of optically-resonant cavity 502 composed of cavity-defining structure 400 embedded in embedding material 430, as shown in FIG. 5, the mode is restricted to the $TE_0$ mode, and the equation for magnetic field $\vec{B}$ is derived from Maxwell's equations:

$$\nabla^2 \vec{B}(\rho,z) + k_o^2 \varepsilon_\perp(\rho,z)\vec{B}(\rho,z) = i\frac{k_o}{c}(\vec{\nabla}\varepsilon_\perp \times \vec{E}) \qquad (4)$$

where c is the velocity of light in free-space, i is the square root of negative one (−1) and the other terms are defined above.

For the purpose of analysis, optically-resonant cavity 502 is divided into cavity elements of homogeneous dielectric constant. Cavity-defining structure 400 and embedding material 430 are each independently divided into cavity elements. FIG. 5 shows exemplary cavity element 426, which is part of reflective plate 402. FIG. 5 also shows central cavity 420 and cylindrical cavity 422, which are both cavity elements and are parts of embedding material 430. The embedding material has dielectric constant different from that of the cavity-defining structure material. Within optically-resonant cavity 502, interfaces exist between adjacent cavity elements of different dielectric constant. For example, cavity element 426 has interfaces with central cavity 420 and cylindrical cavity 426. The inhomogeneous term on the right hand side of Equation (4) exists to ensure the appropriate boundary conditions for the fields at the interfaces between the cavity elements of different dielectric constant. The inhomogeneous term is ignored as long as the boundary conditions are matched across each interface. For the $TE_0$ modes, attention is restricted to the equation for $B_z$.

$$\nabla^2 B_z(\rho,z) + k_o^2 \in_\perp (\rho,z) B_z(\rho,z) = 0 \tag{5}$$

and the other fields will be determined from this field using Maxwell's equations. As described above, if the non-separable term in the expression for $\in_\perp$ given by Equation (2) is ignored, Equation (5) becomes completely separable, and $B_z$ can be rewritten as:

$$B_z(\rho,z) \rightarrow R(\rho) Z(z). \tag{6}$$

Where $R(\rho)$ is a radial function that will be determined below and $Z(z)$ is an axial function that will be determined below.

The partial differential equation in Equation (5) can be written as two ordinary differential equations:

$$\left(\frac{1}{\rho}\frac{d}{d\rho}\left(\rho\frac{d}{d\rho}\right) + k_o^2(\varepsilon_1 + (\varepsilon_2 - \varepsilon_1)f_1(\rho)) - \Lambda\right) R(\rho) = 0 \tag{7}$$

$$\left(\frac{d^2}{dz^2} + k_o^2(\varepsilon_2 - \varepsilon_1)f_2(z) + \Lambda\right) Z(z) = 0 \tag{8}$$

where $\in_1$ is the dielectric constant of embedding material 430 and $\in_2$ is the dielectric constant of the cavity-defining structure material ($\in_2 > \in_1$) and $\Lambda$ is the separation constant.

The radial and axial solutions in each cavity element have the form:

$$R(\rho) = C J_0(\gamma_\rho \rho) + D Y_0(\gamma_\rho \rho) \tag{9}$$

$$Z(z) = A \cos(\gamma_z z) + B \sin(\gamma_z z) \tag{10}$$

in which $\gamma_\rho$ and $\gamma_z$ are commonly described as the propagation vector in the radial and axial directions, respectively, inside of the central cavity 420, where:

$$\gamma_\rho = (k_o^2(\in_1 + (\in_2 - \in_1)f_1(\rho)) - \Lambda)^{1/2} \tag{11}$$

and $$\gamma_z = (k_o^2(\in_2 - \in_1)f_2(z) + \Lambda)^{1/2}. \tag{12}$$

For the $TE_0$ modes, the non-zero fields given by the Maxwell curl equations are:

$$B_z(\rho,z) = R(\rho) Z(z) \tag{13}$$

$$E_\phi(\rho, z) = -\frac{ick_o}{\gamma_\rho^2} R'(\rho) Z(z) \tag{14}$$

$$B_\rho(\rho, z) = \frac{1}{\gamma_\rho^2} R'(\rho) Z'(z) \tag{15}$$

where the prime denotes differentiation with respect to the appropriate argument.

To find a complete solution for a given structure and wavelength, constants A, B, C and D are determined for each cavity element constituting optically-resonant cavity 502, and the separation constant $\Lambda$ is calculated. This is done by matching boundary conditions at each interface, and using the asymptotic conditions of the unbounded radial region extending beyond outer reflective cylinder 412.

To explicitly solve for the axial function $Z(z)$, continuity of $E_\phi$, $B_z$, and $B_\rho$ is imposed at each interface between a cavity element that is part of one of reflective plates 401–406 and a cavity element that is part of embedding material 430 in the optically-resonant cavity. This yields 2×2 matrix equations connecting the coefficients in each cavity element:

$$\begin{pmatrix} A_{i+1} \\ B_{i+1} \end{pmatrix} = [M] \begin{pmatrix} A_i \\ B_i \end{pmatrix}. \tag{16}$$

Restricting to a lowest resonant (spatially even) solution, and imposing the condition that the E-field is zero at major surfaces 450 and 452 that represent the extremes of optically-resonant cavity 502 in the z-direction, a transcendental equation is derived for the separation constant, $\Lambda$:

$$\gamma_z^{2N+1} = -\frac{2}{H} a \tan\left(\frac{M_{11}}{M_{21}}\right) \tag{17}$$

where H is the height of the optically-resonant cavity 502 from major surface 450 to major surface 452. The separation constant $\Lambda$ is determined numerically from Equations (12) and (17), and subsequently all of the coefficients $A_i$ and $B_i$ are determined by matrix concatenation.

An explicit solution for the radial function $R(\rho)$ is similarly computed by enforcing field continuity at each interface between cavity elements of different dielectric constant and connecting the coefficients of adjacent ones of the cavity elements by 2×2 matrix concatenation. To solve for the cavity elements, a physical boundary condition is imposed. The physical boundary condition imposed is that an incoming cylindrical traveling wave is incident upon radial reflective structure 462 and an outgoing cylindrical wave is radiated by the radial reflective structure. Conservation of energy demands that the incoming and outgoing waves be equal in magnitude. However, the waves may differ in phase by a phase shift, $\delta$, so that:

$$[C_{2N+1} J_o(\gamma_\rho^{2N+1}\rho) + D_{2N+1} Y_o(\gamma_\rho^{2N+1}\rho)] \tag{18}$$

is replaced by:

$$\frac{1}{2}[(J_o(\gamma_\rho^{2N+1}\rho) + iY_o(\gamma_\rho^{2N+1}\rho)) + e^{i\delta}(J_o(\gamma_\rho^{2N+1}\rho) - iY_o(\gamma_\rho^{2N+1}\rho))]. \tag{19}$$

The equation determining the phase shift is the result of requiring that the fields remain finite at the origin, $\rho=0$. The field in the central cavity 420 can be connected to the field in an outer cavity element using the 2×2 transfer matrices determined from matching fields at the interfaces, $$\begin{pmatrix} C_1 \\ D_1 \end{pmatrix} = [M] \begin{pmatrix} \cos(\delta/2) \\ \sin(\delta/2) \end{pmatrix}. \quad (20)$$

For the fields to be finite at the origin, $D_1$ is zero, since the Y-functions are singular for a zero argument. Therefore, the equation for the phase shift is:

$$\delta = -2\arctan\left(\frac{M_{21}}{M_{22}}\right). \quad (21)$$

The full solution, and all coefficients, are calculated by the above-described matrix concatenation.

To summarize, using the above described techniques, the full solution is found for a cylindrical wave incident upon the optically-resonant cavity 502. The wavelength at which the optically-resonant cavity 502 is to resonate is specified, then a separation constant and the axial propagation vector $\gamma_z$ are determined, from which the radial propagation vector $\gamma_\rho$ is determined. From these, the phase shift $\delta$ is determined, and all expansion coefficients in all cavity elements can be specified.

The resonant modes of optically-resonant cavity 502 are determined by calculating scattering solutions for different wavelengths in a range of wavelengths and computing the quality factor ($Q_R$) of the mode for each wavelength. The resonant modes are radial modes calculated with the above-stated boundary condition that the E-field is zero at major surfaces 450 and 452. With this boundary condition, there is no loss of stored light energy through emission in the axial direction. The quality factor $Q_R$ is given by:

$$Q_R = \omega \frac{\text{stored energy}}{\text{incident power}} \quad (22)$$

where $\omega$ is the angular frequency corresponding to the wavelength.

Figure 10A:
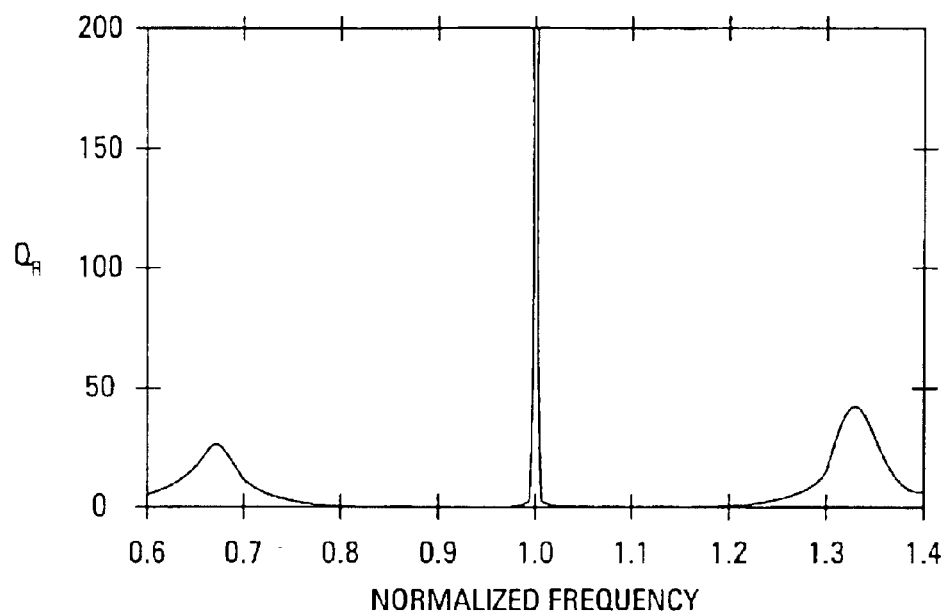
FIG. 10A is a graph illustrating the quality factor ($Q_R$) of the optically-resonant cavity shown in FIG. 5 for radially-emitted light versus the normalized frequency of the light.
Figure 10B:
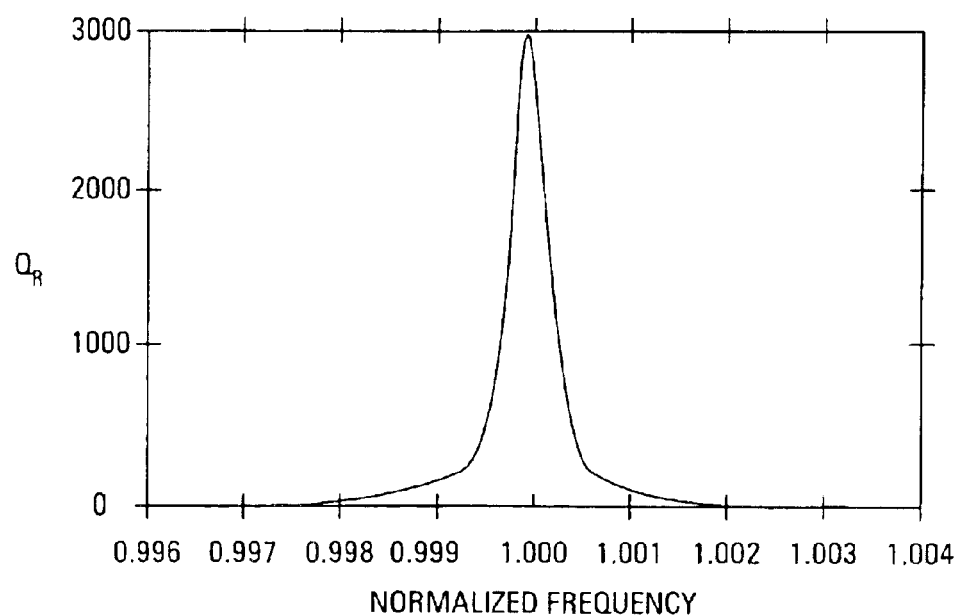
FIG. 10B is a graph showing the central peak in FIG. 10A over a narrower range of the normalized frequency.

The stored energy and incident power are computed from calculated field distributions, as known in the art. A plot of $Q_R$ versus $\omega$ displays a number of broad peaks at frequencies at which light energy is stored in the optically-resonant cavity and a single peak of very high $Q_R$. The broad peaks correspond to weak resonances, whereas the single peak corresponds to the $TE_0$ mode in which all the reflective plates 401–406 and reflective cylinders 410–412 act coherently to trap the excitation light. FIGS. 10A and 10B show plots of $Q_R$ versus normalized frequency for an exemplary optically-resonant cavity composed of four concentric reflective cylinders and four pairs of reflective plates and in which the dielectric constant of the cavity-defining structure material is 11.56 and that of the embedding material is 2.25. FIG. 10A shows the variation of $Q_R$ over a wide range of the normalized frequency and illustrates the broad peaks described above. FIG. 10B shows the variation of $Q_R$ over a narrow range of the normalized frequency and illustrates the extremely high $Q_R$ of the $TE_0$. The extremely high $Q_R$ indicates the efficiency of an embodiment of optically-resonant cavity 502 designed using the above-described design rules.

Now the coupling of excitation light 104 having a defined wavelength to optically-resonant cavity 502 will be described. The analysis technique used to determine the coupling of the excitation light from single-mode optical gain structure 103 to the optically-resonant cavity is a version of coupled mode theory.

First, the equations derived from Maxwell's equations for the electromagnetic fields related to light are written down:

$$\nabla^2 \vec{E} - \frac{\varepsilon_r}{c^2}\ddot{\vec{E}} + \vec{\nabla}\left(\frac{1}{\varepsilon_r}(\vec{\nabla}\varepsilon_r)\cdot\vec{E}\right) = 0 \quad (23)$$

$$\nabla^2 \vec{H} - \frac{\varepsilon_r}{c^2}\ddot{\vec{H}} + \varepsilon_o(\vec{\nabla}\varepsilon_r)\times\dot{\vec{E}} = 0 \quad (24)$$

where a dot above a field denotes a time derivative, $\varepsilon_o$ is the permittivity of free-space, and $\varepsilon_r$ is the relative permittivity of the medium through which the light propagates. The inhomogeneous terms in the above wave equations are terms that ensure proper boundary conditions between elements of different dielectric constant.

It is assumed that the unperturbed fields of isolated optically-resonant cavity 502 are known. The electric field is specified by $\vec{E}_D$. Similarly, it is assumed that the unperturbed fields of isolated single-mode optical gain structure 103 are also known. The electric field is specified by $\vec{E}_W$. The relative dielectric constant $\overline{\varepsilon}_W(\vec{x})$ of isolated single-mode optical gain structure 103 at position $\vec{x}$ is given by $\varepsilon_W(\vec{x}) = \varepsilon_S + \overline{\varepsilon}_W(\vec{x})$, where $\varepsilon_S$ is the relative dielectric constant of the embedding material and $\overline{\varepsilon}_W(\vec{x})$ corresponds to the deviation of the relative dielectric constant of the material(s) of isolated single-mode optical gain medium 103 from that of the embedding material.

Similarly, the relative dielectric constant of isolated optically-resonant cavity 502 is given by $\varepsilon_D(\vec{x}) = \varepsilon_S + \overline{\varepsilon}_D(\vec{x})$, where $\overline{\varepsilon}_D(\vec{x})$ corresponds to the deviation of the relative dielectric constant of the material(s) of isolated optically-resonant cavity 502 from that of the embedding material. Accordingly, the electric fields $\vec{E}_D$ and $\vec{E}_W$ satisfy the following equations:

$$\nabla^2 \vec{E}_W - \varepsilon_W k_o^2 \vec{E}_W + \vec{\nabla}\left(\frac{1}{\varepsilon_W}(\vec{\nabla}\varepsilon_W)\cdot\vec{E}_W\right) = 0 \quad (25)$$

$$\nabla^2 \vec{E}_D - \varepsilon_D k_o^2 \vec{E}_D + \vec{\nabla}\left(\frac{1}{\varepsilon_D}(\vec{\nabla}\varepsilon_D)\cdot\vec{E}_D\right) = 0. \quad (26)$$

The approximate coupled mode solution to a composite system including both isolated optically-resonant cavity 502 and isolated single-mode optical gain structure 103 is defined in terms of the unperturbed fields $$\vec{E} = A(t)\vec{E}_W + B(t)\vec{E}_D \quad (27)$$

where $A(t)$ and $B(t)$ are time-dependent coefficients specifying how excitation light 104 is shared between the single-mode optical gain structure and the optically-resonant cavity as a function of time. Plugging the solution ansatz of Equation (27) into dynamical Equation (23), using the unperturbed field equations and approximations that $|\dot{A}| << |\omega A|, |\dot{B}| << |\omega B|$, and ignoring the inhomogeneous boundary terms in a perturbative treatment, yields:

$$\frac{\omega^2}{c^2}\overline{\varepsilon}_D A\vec{E}_W + \frac{2i\omega}{c^2}(\varepsilon_S + \varepsilon_W)\dot{A}\vec{E}_W + \quad (28)$$

$$\frac{\omega^2}{c^2}\overline{\varepsilon}_W B\vec{E}_D + \frac{2i\omega}{c^2}(\varepsilon_S + \varepsilon_D)\dot{B}\vec{E}_D = 0.$$

To obtain scalar differential equations for time-dependent expansion coefficients, Equation (28) is multiplied by one of the unperturbed fields and is integrated over all space. To simplify this process, the following notation is used:

$$\langle W|\in_i|D\rangle = \int \vec{E}_W^* \cdot \vec{E}_D \in_i(x) d^3x \quad (29)$$

and the hierarchy of magnitudes of overlap integrals is catalogued, $$\langle W|\bar{\in}_W|W\rangle \sim 1 \quad (30)$$

$$\langle W|\bar{\in}_W|D\rangle \sim \eta \quad (31)$$

$$\langle D|\bar{\in}_W|D\rangle \sim \eta^2 \quad (32)$$

where $\eta$ is a parameter that characterizes the magnitude of the overlap between the evanescent fields and the perturbing structures. Using this notation, assuming that $\eta$ is small and keeping only the lowest order terms in $\eta$, multiplying Equation (28) by $\vec{E}_W$ and integrating over all space yields:

$$\dot{A} - i\gamma_1 B = 0 \quad (33)$$

where:

$$\gamma_1 = \frac{\omega}{2} \frac{\langle W|\bar{\varepsilon}_W|D\rangle}{\langle W|\varepsilon_W|W\rangle}. \quad (34)$$

Similarly, multiplying Equation (28) by $\vec{E}_D$ and integrating over all space yields:

$$\dot{B} - i\gamma_2 A = 0 \quad (35)$$

where:

$$\gamma_2 = \frac{\omega}{2} \frac{\langle D|\bar{\varepsilon}_D|W\rangle}{\langle D|\varepsilon_D|D\rangle}. \quad (36)$$

The solutions to Equations (33) and (35) have the form:

$$A(t) \sim e^{\pm i\Gamma t} \text{ and } B(t) \sim e^{\pm i\Gamma t} \quad (37)$$

where:

$$\Gamma^2 = \gamma_1 \gamma_2 = \frac{\omega^2}{4} \frac{\langle W|\bar{\varepsilon}_W|D\rangle\langle D|\bar{\varepsilon}_D|W\rangle}{\langle W|\varepsilon_W|W\rangle\langle D|\varepsilon_D|D\rangle}. \quad (38)$$

The coupling rate $\Gamma$ is calculable from the above-described expressions for the unperturbed fields of optically-resonant cavity 502 and single-mode optical gain structure 103. The rate of energy transfer between single-mode optical gain structure 103 and optically-resonant cavity 102 increases as the single-mode optical gain structure and optically-resonant cavity are brought closer together and have larger evanescent field overlaps.

Equations (33) and (35) can be generalized to include two possible additional physical processes. Specifically, Equation (35) can be modified to take into account the energy loss resulting from the emission of output light beam 105 by optically-resonant cavity 502:

$$\dot{B} - i\gamma_2 A + \gamma_D B = 0 \quad (39)$$

where $\gamma_D = \omega/(2Q_T)$ and $Q_T$ is the total quality factor. Unlike $Q_R$, which only takes account of emission in the radial direction, $Q_T$ takes account of emission in both the radial and axial directions. Of these, the axial emission accounts for the majority of the energy lost from the optically-resonant cavity.

Additionally, Equation (33) can be generalized to include the effect of the gain provided by single-mode optical gain structure 103:

$$\dot{A} - i\gamma_1 B + \gamma_W A = 0 \quad (40)$$

where $\gamma_W$ is the coefficient of the exponential gain typically associated with an active gain structure.

Equations (39) and (40) are used to determine the threshold gain condition of a CRCSEL composed of optically-resonant cavity 502 and single-mode optical gain medium 103. A steady-state lasing condition is obtained when the time derivatives in Equations (39) and (40) are set equal to zero:

$$-i\gamma_2 A + \gamma_D B = 0 \quad (41)$$

$$-i\gamma_2 B - \gamma_W A = 0. \quad (42)$$

A non-trivial solution requires that the determinant of the coefficients vanishes, yielding:

$$\gamma_W \gamma_D - \gamma_1 \gamma_2 = 0. \quad (43)$$

From this, an expression for the threshold gain condition can be written:

$$\gamma_W = \Gamma^2/\gamma_D. \quad (44)$$

This expression can be written in more familiar terms by noting that the gain term $\gamma_W$ for the field amplitude is related to the typical definition of gain by $$g_{th} = \frac{4Q_T \Gamma^2}{c\omega}. \quad (45)$$

where c is the velocity of light in free space and g is the gain. The expression for the light energy loss $\gamma_D$ from optically-resonant cavity 102 can be written in terms of $Q_T$, i.e., $\gamma_D = \omega/(2Q_T)$, yielding for the threshold gain $g_{th}$:

$$\frac{\gamma_W}{c} = \frac{g}{2},$$

Equation (45) is used to calculate the minimum gain of the active region that forms part of single-mode optical gain structure 103 that ensures that CRCSELs 100, 110, 120 and 130 of a given geometry will lase.

The design rules for optically-resonant cavity 502 that forms part of the CRCSELs of the invention will now be described. First, assuming the dielectric constants $\in_1$ and $\in_2$ are given as a constraint of the materials system under consideration, only the desired resonant frequency $\omega$ need be specified. Additionally, since resonance frequency depends on the volume of central cavity 420, the dimension of the central cavity in the z-direction, i.e., the height L, also needs to be specified. The height of the central cavity is specified to give the central cavity a desired aspect ratio, i.e., ratio of height to radius. Decreasing the aspect ratio of the central cavity increases the preference of the optically-resonant cavity to radiate in the axial direction.

The first intermediate parameters to define are the k-vector components $k_{zi}$ and $k_{\rho i}$ of a resonant mode for the cavity components of central cavity 420 having the dielectric constants $\in_1$ and $\in_2$. If the height of the central cavity is L, the resonance condition is that a mode undergoes a phase shift that is an integral multiple of $2\pi$ for a round trip in the z-direction, i.e., $2Lk_{z1} = 2n\pi$, where n is the order of the mode. For the lowest-order mode, n=1 and:

$$k_{zl} = \frac{\pi}{L}. \quad (46)$$

The other k-vector components are determined using the defining relation from the wave equation, $\in k_o^2 = k_{zi}^2 + k_{\rho i}^2$, $$k_{\rho 1} = (\varepsilon_1 k_o^2 - (\pi/L)^2)^{\frac{1}{2}} \quad (47)$$

$$k_{z2} = ((\varepsilon_2 - \varepsilon_1)k_o^2 - (\pi/L)^2)^{\frac{1}{2}} \quad (48)$$

$$k_{\rho 2} = (\varepsilon_2 k_o^2 - (\pi/L)^2)^{\frac{1}{2}}. \quad (49)$$

A first design rule is that reflective plates 401–406 and the reflective cylinders 410–412 shown in FIG. 5 have thicknesses equal to one-quarter of the desired emission wavelength in the cavity-defining structure material of dielectric constant $\in_2$. This maximizes the reflectivities of the individual reflective plates and reflective cylinders, and thus minimizes the number of reflective plates and reflective cylinders needed to provide a given $Q_T$. It is an additional design advantage that a thickness of one quarter of the wavelength results in the reflected waves having zero phase shift. Therefore, each reflective plate 401–406 has a thickness $T_Z$ given by:

$$T_Z = \frac{(\pi/2)}{k_{z2}} \quad (50)$$

and each reflective cylinder 410–412 has a thickness $T_\rho$ given by:

$$T_\rho = \frac{(\pi/2)}{k_{\rho 2}}. \quad (51)$$

The next step is to determine the internal radius of inner reflective cylinder 410, which defines the radius of the central cavity 420. The internal radius of reflective cylinder 410 is calculated by reapplying the resonance condition describe above, imposing the condition that the resonant mode undergo a phase shift of an integral multiple of $2\pi$ for a round trip between the origin at $\rho=0$ and the inside surface of the inner reflective cylinder. A radially-propagating electric field solution of the wave equation in optically-resonant cavity 102 is a Hankel function of the first kind, defined by $H_1^{(1)}(x)=J_1(x)+iY_1(x)$. The resonance condition is satisfied for a phase distance corresponding to the first zero of the Bessel function $J_1$, denoted by $x_{11}$. The value of $x_{11}$ is a constant approximately equal to 3.8317. From this condition, the inside radius $\rho_1$ of inner reflective cylinder 410 is determined using:

$$\rho_1 = \frac{x_{11}}{k_{\rho 1}}. \quad (52)$$

Having determined the thicknesses of reflective plates 401–406 and reflective cylinders 410–412 and having determined the distance between the inside surfaces of reflective plates 401 and 402 and the inside radius of reflective cylinder 410, it is straight forward to extend the arguments to calculate the positions of the inside surfaces of reflective plates 403–406 along the axis of rotational symmetry of the reflective cylinders and inside radii of reflective cylinders 411 and 412.

The inside surfaces of the reflective elements defining the central cavity 420 are placed at what would be the E-field nulls of a simple cylindrical cavity uniformly filled with embedding material 430 of dielectric constant $\in_1$. The above-defined positions of reflective plates 403–406 are determined by extending the harmonic solution applied to the central cavity in the z-direction and placing the inside surfaces, i.e., the major surfaces facing the central cavity, of each additional pair of reflective plates at sequential ones of the nulls in the E-field.

The harmonic solution phase shift is corrected for the additional phase shift across the reflective plates interior to the current reflective plate. This correction is needed because the additional phase shift across each reflective plate causes a slight change in the location where the next E-field null is expected to occur. Thus, when determining the positions of reflective plates 403 and 404, the small change in the location of the second E-field null caused by the additional phase shift across reflective plates 401 and 402, respectively, are taken into account. Moreover, when determining the positions of reflective plates 405 and 406, the small change in the location of the third E-field null caused by the additional phase shift across reflective plates 401, 403 and 402, 404, respectively, are taken into account. The additional phase shift is calculated by taking into account the different velocity of light in the cavity-defining structure material and the embedding material.

Similarly, the radii of the additional reflective cylinders 411 and 412 are determined by extending the radial Bessel function solution applied to central cavity 420, and locating the inside surface of each additional reflective cylinder at the position of one of the E-field nulls. Again, the additional phase shift caused by the reflective cylinders interior to the current reflective cylinder is taken into account in determining the position of the E-field null.

As noted above, the cavity-defining structure that forms part of the optically-resonant cavity needs to be asymmetrical in the z-direction for the optically-resonant cavity to emit output light beam 105 preferentially in the +z-direction. Referring again to FIG. 6, to enable optically-resonant cavity 602 to emit output light beam 105 preferentially in the +z-direction, cavity-defining structure 440 is structured to have fewer reflective plates in the +z-direction relative to central cavity 420 than in the −z-direction.

Calculating the light radiation pattern of optically-resonant cavity 602 that includes asymmetrical cavity-defining structure 440 is difficult for a number of reasons. Removal of the confining boundary condition at major surface 450 precludes an analytical solution for a radiating resonant mode. Also, the radiation resonant modes are not normalizable, making an approximate mode matching procedure unworkable. As a result, the best way of approximately calculating the light emission properties of optically-resonant cavity 602 is perturbative.

It is assumed, for the sake of calculating the light emission pattern, that resonant mode fields at the major surface 450 of asymmetric optically-resonant cavity 602 are the same as fields that would exist if optically-resonant cavity 602 included symmetrical cavity-defining structure 400 shown in FIG. 5. This is probably a reasonable approximation if the quality factor $Q_T$ remains relatively large notwithstanding the emission of output light beam 105. The resonant mode fields are given on what is assumed to be an infinite planar surface, and impressed fields are assumed to be zero away from the optically-resonant cavity. Green's second identity can be applied to find the fields at any point in the half-space above major surface 450. The expressions for electric and magnetic fields at points far from major surface 450 take the form:

$$\vec{E}(\vec{x}) = \frac{e^{ikr}}{4\pi ir}\vec{k} \times \oint_S e^{-i\vec{k}\cdot\vec{x}'}\left[-\frac{\vec{k}\times(\hat{n}'\times\vec{B}(\vec{x}'))}{k/c} - \hat{n}'\times\vec{E}(\vec{x}')\right]da' \quad (53)$$

$$\vec{B}(\vec{x}) = \frac{e^{ikr}}{4\pi ir}\vec{k} \times \oint_S e^{-i\vec{k}\cdot\vec{x}'}\left[-\frac{\vec{k}\times(\hat{n}'\times\vec{E}(\vec{x}'))}{kc} - \hat{n}'\times\vec{B}(\vec{x}')\right]da' \quad (54)$$

where r is the distance from a point on the major surface to the observation point, $\vec{k}$ is the free space wave vector, da' is the surface area differential element to be integrated over the surface S, and $\hat{n}'$ is the surface normal unit vector. Resonator fields on the surface S needed to complete the integrations of Equations (53) and (54) are known from the previous calculations. Specifically, the mode solutions of asymmetric optically-resonant cavity 602 are given as products of Bessel and trigonometric functions as shown in Equations (9, 10, and 13–15). This simple solution form allows the integrals of Equations (53) and (54) to be done analytically yielding closed form expressions for the radiated fields.

An embodiment of optically-resonant cavity 502 incorporating an embodiment of symmetrical cavity-defining structure 400 composed of ten reflective cylinders and three pairs of reflective plates, with the material of the cavity-defining structure having a dielectric constant of 11.56 and embedding material 430 having a dielectric constant of 2.25, is specified using the design rules. The computed $Q_R$ of the optically-resonant cavity is $1.0\times10^8$, ignoring materials losses. The computed $Q_R$ only takes account of light emission in the radial direction because of boundary conditions imposed on the analysis. A measured value of $Q_R$ would, of course, be much lower due to materials losses.

An optically-resonant cavity similar to that just described, but incorporating an asymmetrical cavity-defining structure having one fewer reflective plate in the +z-direction than in the −z-direction would have a computed $Q_T$ of about $2\times10^6$. The main cause of the difference between the computed $Q_R$ of the symmetrical embodiment described above and the computed $Q_T$ of this asymmetrical embodiment is the energy loss due to the emission of output light beam 105 in the z-direction. In the resonant mode of the optically-resonant cavity incorporating the asymmetrical cavity-defining structure, roughly 50 times more energy is emitted axially in the +z-direction than is emitted radially into embedding material 430.

An optically-resonant cavity incorporating an embodiment of an asymmetrical cavity-defining structure in which there are two fewer reflective plates in the +z-direction than in the −z-direction has a calculated $Q_T$ of about $5.7\times10^4$. This embodiment emits light very strongly in the axial direction. This embodiment emits roughly 2000 times more light energy axially in the +z-direction than it emits radially. From this example, it can be seen that, in an optically-resonant cavity incorporating an axially asymmetrical cavity-defining structure, the coupling of the resonant modes of the optically-resonant cavity to the emitted light beam 105 can be adjusted over a very broad range.

This disclosure describes the invention in detail using illustrative embodiments. However, it is to be understood that the invention defined by the appended claims is not limited to the precise embodiments described.

We claim:

1. A surface-emitting laser, comprising a layer structure, the layer structure comprising:
    a single-mode optical gain structure structured to generate excitation light having a wavelength and a direction, the optical gain structure surrounded by an evanescent field associated with the excitation light; and
    an optically-resonant cavity located alongside the single-mode optical gain structure not intersecting therewith, the optically-resonant cavity optically coupled by the evanescent field to the single-mode optical gain structure to receive part of the excitation light therefrom, the optically-resonant cavity structured to emit an output light beam in a direction orthogonal to the direction of the excitation light.

2. The surface-emitting laser of claim 1, in which the single-mode optical gain structure includes an elongate optical waveguide through which the excitation light propagates.

3. The surface-emitting laser of claim 2, in which the waveguide includes and active region in which the excitation is generated.

4. The surface-emitting laser of claim 3, in which the single-mode optical gain structure additionally includes reflective elements operative to impose a single mode on the excitation light.

5. The surface-emitting laser of claim 3, in which the single-mode optical gain structure comprises one-dimensional distributed Bragg reflectors separated from one another along the length of the waveguide.

6. The surface-emitting laser of claim 3, in which the single-mode optical gain structure comprises a diffraction grating disposed along the length of the waveguide.

7. The surface-emitting laser of claim 1, in which the optically-resonant cavity includes:
    a cavity-defining structure of a cavity-defining structure material having a first dielectric constant; and p1 a material filling interstices in the cavity-defining structure, the material having a second dielectric constant different from the first dielectric constant.

8. The surface-emitting laser of claim 1, in which the optically-resonant cavity is structured to emit the output light beam with an axially symmetric radiation pattern.

9. The surface-emitting laser of claim 1, in which the layer structure additionally comprises:
    a substrate of gallium arsenide; and
    a layer of embedding material in which the optically-resonant cavity is located, the embedding material including aluminum arsenide.

10. The surface-emitting laser of claim 1, in which the layer structure additionally comprises:
    a substrate of indium phosphide; and
    a layer of embedding material in which the optically-resonant cavity is located, the embedding material including indium gallium arsenide phosphide.

11. The surface-emitting laser of claim 1, in which the layer structure additionally comprises at least one additional optically-resonant cavity optically coupled to the single-mode optical gain structure, each of the at least one optically-resonant cavity structured to emit a respective output light beam in a direction substantially orthogonal to the excitation light.

12. The surface-emitting laser of claim 1, in which the optically-resonant cavity is located alongside the single-mode optical gain structure and separated therefrom by a distance of less than one wavelength of the excitation light.

13. A surface-emitting laser, comprising:
    a single-mode optical gain structure structured to generate excitation light having a wavelength and a direction; and
    an optically-resonant cavity optically coupled to the single-mode optical gain structure to receive part of the excitation light therefrom, the optically-resonant cavity structured to emit an output light beam in a direction orthogonal to the excitation light, the optically-resonant cavity comprising:

a cavity-defining structure of a cavity-defining structure material having a first dielectric constant, the cavity-defining structure comprising:

a reflective cylinder of the cavity-defining structure material, the reflective cylinder having an axis of rotational symmetry parallel to the output light beam; and reflective plates arrayed along the axis of rotational symmetry of the reflective cylinder, the reflective plates intersecting the reflective cylinder, a material filling interstices in the cavity-defining structure, the material having a second dielectric constant different from the first dielectric constant.

14. The surface-emitting laser of claim 13, in which:

the reflective cylinder is a first reflective cylinder; and the cavity-defining structure additionally comprises at least one additional reflective cylinder arranged concentrically with the first reflective cylinder and intersecting with the reflective plates.

15. The surface-emitting laser of claim 13, in which:

the reflective cylinder and a pair of the reflective plates collectively define a central cavity; and fewer of the reflective plates are disposed along the axis of rotational symmetry in one direction relative to the central cavity than in the opposite direction.

16. A method generating coherent light, the method comprising:

providing a layer structure, the layer structure comprising an optically-resonant cavity;

externally of the layer structure, generating excitation light having a single optical mode in a direction parallel to a major surface of the layer structure, the excitation light having an evanescent field associated therewith;

coupling part of the excitation light to the optically-resonant cavity via the evanescent field; and preferentially emitting the received excitation light from the optically-resonant cavity in a direction orthogonal to the major surface.

17. The method of claim 16, in which generating the excitation light includes generating the excitation light by stimulated emission.

18. The method of claim 16, in which preferentially emitting the received excitation light includes emitting the received excitation light in an axially asymmetric radiation pattern.

19. The method of claim 18, in which, in providing an optically-resonant cavity, an optically-resonant cavity structured to be optically resonant at the wavelength of the excitation light and having an axially-asymmetric containment characteristic is provided.

20. The method of claim 19, in which the method additionally comprise locating the optically-resonant cavity at a distance from the excitation light of less than the wavelength of the excitation light.

21. The method of claim 16, in which generating the excitation light includes:

providing one-dimensional distributed Bragg reflectors; and using the one-dimensional distributed Bragg reflectors to impose the single optical mode on the excitation light.

22. The method of claim 16, in which generating the excitation light includes:

providing a diffraction grating; and using the diffraction grating to impose the single optical mode on the excitation light.

* * * * *